(12) United States Patent
Hashi et al.

(10) Patent No.: US 7,342,749 B2
(45) Date of Patent: Mar. 11, 2008

(54) METHOD OF REMOVING LEAD-FREE SOLDER FROM SLIDER PAD AND MAGNETIC DISK DRIVE

(75) Inventors: Nobuyuki Hashi, Kanagawa (JP); Yuhsuke Matsumoto, Kanagawa (JP); Takuya Satoh, Kanagawa (JP); Tatsushi Yoshida, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 390 days.

(21) Appl. No.: 11/179,219

(22) Filed: Jul. 11, 2005

(65) Prior Publication Data

US 2006/0012918 A1 Jan. 19, 2006

(30) Foreign Application Priority Data

Jul. 16, 2004 (JP) .............................. 2004-209508

(51) Int. Cl.
*G11B 5/48* (2006.01)
(52) U.S. Cl. ................... 360/245.8; 360/235.4; 360/264.2
(58) Field of Classification Search ............. 360/245.8, 360/234.5, 235.4; 29/603.04, 603.06; 228/248.1
See application file for complete search history.

(56) References Cited

U.S. PATENT DOCUMENTS

| | | | |
|---|---|---|---|
| 5,699,212 A * | 12/1997 | Erpelding et al. ....... | 360/245.8 |
| 6,719,188 B2 | 4/2004 | Farooq et al. | |
| 6,796,018 B1 * | 9/2004 | Thornton ................. | 29/603.04 |
| 6,829,818 B2 * | 12/2004 | Kamigama et al. ...... | 29/603.06 |
| 2002/0029461 A1 * | 3/2002 | Kamigama et al. ...... | 29/603.06 |
| 2002/0133933 A1 * | 9/2002 | Erpelding et al. ....... | 29/603.04 |
| 2005/0195527 A1 * | 9/2005 | Yamaguchi .............. | 360/234.5 |
| 2006/0193084 A1 * | 8/2006 | Satoh et al. ............. | 360/234.5 |
| 2006/0219760 A1 * | 10/2006 | Wagoh et al. ........... | 228/248.1 |

FOREIGN PATENT DOCUMENTS

| | | |
|---|---|---|
| JP | 01-130590 | 5/1989 |
| JP | 05-152727 | 6/1993 |
| JP | 07-106739 | 4/1995 |
| JP | 11-026918 | 1/1999 |

\* cited by examiner

*Primary Examiner*—Tianjie Chen
(74) *Attorney, Agent, or Firm*—Townsend and Townsend and Crew LLP; Duke Amniampong

(57) ABSTRACT

A method for removing a lead-free solder from a slider pad is provided to permit re-utilization of a head/slider used in a magnetic disk drive. In one embodiment, a slider pad formed on a head/slider and a lead pad are connected to each other through a lead-free solder fillet. A cutting tool is heated beforehand to a temperature near the melting point of the lead-free solder. The cutting tool is moved in parallel with a surface of the slider pad to cut the solder fillet while softening the solder fillet. The solder fillet is removed so as not to impose a stress on the slider pad and in a state in which the head/slider can be re-utilized.

20 Claims, 10 Drawing Sheets

(A)

(C)

(B)

(D)

(A)

(B)

(A)

(B)

(A)

(B)

(C)

(D)

METHOD OF REMOVING LEAD-FREE SOLDER FROM SLIDER PAD AND MAGNETIC DISK DRIVE

CROSS-REFERENCES TO RELATED APPLICATIONS

This application claims priority from Japanese Patent Application No. JP2004-209508, filed Jul. 16, 2004, the entire disclosure of which is incorporated herein by reference.

BACKGROUND OF THE INVENTION

The present invention relates to a technique of removing a lead-free solder from a slider pad in a magnetic disk drive and more particularly to a technique of removing a lead-free solder from a slider pad in such a mode as is suitable for re-utilization of a head/slider.

In a magnetic disk drive, a head formed on a slider (an integral structure of the head and the slider will hereinafter be referred to as "head/slider") flies while retaining a slight gap from a surface of a magnetic disk and writes or reads data to or from the magnetic disk. An air bearing surface ("ABS" hereinafter) is formed on a surface of the head/slider opposed to the magnetic disk. The ABS is formed so that a positive pressure as a lifting force is generated in the slider when an air flow created on a surface of a rotating magnetic disk passes between the ABS and the surface of the magnetic disk. As the case may be, the ABS is formed so as to also generate a negative pressure for stabilizing posture when the head/slider flies. The head/slider is attached to a spring structure called flexure. While the head/slider flies over the surface of the magnetic disk, the head/slider performs pivotal motions or gimbaled motions so that the spacing between the head and a magnetic layer of the magnetic disk is within a predetermined range.

The flexure is secured to a load beam, which in turn is secured to an actuator assembly, the actuator assembly being driven by a voice coil motor ("VCM" hereinafter). In the magnetic disk drive there is provided a circuit board on which are mounted circuit components for data communication and for controlling the magnetic disk drive. The circuit board and the head are electrically connected with each other through a lead wire. A slider pad connected to the head is formed on an end face of the head/slider. The slider pad and a lead pad formed on an end portion of the lead wire disposed near the slider/pad are soldered to each other.

In a magnetic disk drive manufacturing process, there sometimes occurs a case where a defect is found on the lead wire side in an electric test conducted in an integrated state of the lead wire and the head after the connection of the slider pad with the lead pad. In a wiring integrated suspension wherein a wiring layer as a lead wire is integral with a metal layer of a flexure, it is difficult to repair the lead wire. Further, since the cost of the head/slider is high, the head/slider is re-utilized if there is found no defect therein. For re-utilizing the head/slider it is necessary to remove the soldered connection between the slider pad and the lead pad and remove the head/slider from the flexure.

The conventional tin-lead eutectic alloy solder is relatively soft even at room temperature, so even if it is scraped off from the slider pad with use of a cutting tool at room temperature, there is no fear of damage to the slider pad and the head/slider can be re-utilized. Recently, for the prevention of environmental pollution, a lead-free solder has come to be used in many electric devices. The lead-free solder when solidified is harder than such a lead-containing solder as tin-lead eutectic alloy solder and therefore, when an attempt is made to scrape off the lead-free solder from the slider pad with use of a cutting tool at room temperature, there arises the problem that the slider pad is damaged and it is virtually impossible to re-utilize the head/slider.

Patent Document 1 (Japanese Patent Laid Open No. Hei 7-106739) discloses a technique of heating a packaging substrate to a temperature of not higher than the melting point of solder by means of a heater to decrease the peeling strength of a solder ball relative to flux, followed by contact of an adhesive layer in a suction device with the packaging substrate, and peeling the solder ball from the packaging substrate with an adhesive force. Patent Document 2 (Japanese Patent Laid Open No. Hei 5-152727) discloses a technique of heating a printed wiring board to a predetermined temperature higher than the softening temperature of flux and lower than the melting temperature of solder, rubbing a surface of the printed wiring board with a brush and at the same time sucking air in the rubbed packaging surface area to peel and absorb a solder ball adhered to the packaging surface. Patent Document 3 (Japanese Patent Laid Open No. Hei 1-130590) discloses a technique of softening flux with heated steam and removing the flux and a solder ball with a blowing force. Patent Document 4 (Japanese Patent Laid Open No. Hei 11-26918) discloses a technique of heating solder to a softening temperature thereof and scraping off the solder with a scraping edge.

BRIEF SUMMARY OF THE INVENTION

A slider pad is a small conductive area formed on a slider surface and is low in mechanical strength. Therefore, if a stress is imposed on a slider pad at the time of removing solder, the slider pad is damaged and it becomes virtually impossible to re-utilize a head/slider. A solution to this problem may be the application of heat to soften the solder which has solidified. However, this method is not desirable because if the head/slider is put into a reflow furnace, there is a fear that heat may be applied also to the head, causing damage to the head. Particularly, since the melting point of a lead-free solder is high, the possibility of damage to the head further increases even if the internal temperature of the reflow furnace is set at a temperature near the melting point.

If there is adopted a method in which heat is applied to the solder locally with a laser beam, melting will occur, beginning with a surface of the solder, with consequent adhesion of splashes of melted solder to the slider surface, causing a short-circuit between slider pads and making re-utilization of the head/slider difficult. Moreover, in case of adopting a solder ball connecting method using the irradiation of a laser beam for re-connection between he slider pad and the lead pad, a solder ball cannot be temporarily positioned at an exact position if the surface of the slider pad is not flat. In this connection, according to the method in which solder is melted off from the slider pad, the solder remains as concaves and convexes on the surface of the slider pad, thus making it virtually impossible to effect solder ball connection.

Accordingly, it is a feature of the present invention to provide a method and device for removing a lead-free solder from a slider pad used in a magnetic disk drive. It is another feature of the present invention to provide a method for cutting a solder fillet of a lead-free solder from a slider pad to re-utilize a head/slider. It is a further feature of the present invention to provide a magnetic disk drive using a head/slider after removal of a lead-free solder.

In a first aspect of the present invention there is provided a method for removing a lead-free solder from a slider pad formed on a head/slider used in a magnetic disk drive, the method including providing a cutting tool for removing the lead-free solder, heating the cutting tool to a temperature at which the lead-free solder softens and which is not higher than the melting point of the lead-free solder, and removing the lead-free solder from the slider pad by means of the cutting tool.

The lead-free solder adhered to the slider pad is softened and removed by the heated cutting tool. Since the temperature of the cutting tool is set to a temperature at which the lead-free solder softens and which is not higher than the melting point of the lead-free solder, there is no fear of damage to the slider pad at the time of removal thereof. Further, there occurs neither short-circuit between slider pads caused by melted solder nor deposition of melted solder as lumps on the slider pad surface, so that the solder can be removed so as to be suitable for re-utilization of the head/slider. In the cutting step, including the period in which the cutting tool contacts the lead-free solder to remove the solder, the temperature of the cutting tool may be controlled in the range of between the melting point of the lead-free solder and a temperature about 20° C. lower than the melting point.

Since the cutting tool moves in parallel with the surface of the slider pad and can thereby flatten its cutting trace, it is possible to adopt a solder ball connecting method at the time of re-utilizing the head/slider. When the lead-free solder adhered to the slider pad is a solder fillet and the slider pad is formed of gold, a gold-solder alloy layer is formed between the solder fillet and the gold. If a flat alloy layer or flat solder remains on the slider pad-side cut surface after removing the solder with the cutting tool, re-connection of the solder is facilitated under the same action as in the use of spare solder.

In a second aspect of the present invention there is provided a method for re-utilizing a head/slider used in a magnetic disk drive, including providing a flexure assembly in which a lead pad formed on a lead wire and a slider pad formed on the head/slider are connected with each other through a solder fillet of a lead-free solder, providing a cutting tool for cutting the lead-free solder, heating the cutting tool to a temperature at which the lead-free solder softens and which is not higher than the melting point of the lead-free solder, cutting a position near a boundary between the solder fillet and the slider pad by means of the heated cutting tool, and removing the head/slider from the flexure assembly.

In a third aspect of the present invention there is provided a magnetic disk drive including a magnetic disk, a flexure assembly having a head/slider with a slider pad formed thereon and a lead wire with a lead pad formed thereon, the slider pad and the lead pad being soldered to each other, and an actuator assembly which supports the flexure assembly, wherein a soldered surface of the slider pad is formed by removing a solder fillet of a lead-free solder connected to the slider pad by means of a cutting tool having been heated to a temperature at which the lead-free solder softens and which is not higher than the melting point of the lead-free solder.

In a fourth aspect of the present invention there is provided a lead-free solder cutting device for cutting a solder fillet of a lead-free solder from a slider pad formed on a head/slider used in a magnetic disk drive, the lead-free solder cutting device including a stage for fixing a flexure assembly to which the head/slider is attached, a feed section for feeding a cutting tool, a position detecting section for detecting the position of the head/slider relative to the cutting tool, a temperature control section for controlling the temperature of the cutting tool to a temperature at which the lead-free solder softens and which is not higher than the melting pint of the lead-free solder, and a control section which, upon receipt of a signal from the position detecting section, transmits a position control signal to the stage or the feed section.

According to the present invention, a method and device for removing a lead-free solder from a slider pad used in a magnetic disk drive could be provided. Moreover, a method for cutting a solder fillet of a lead-free solder from a slider pad to re-utilize a head/slider could be provided. Further, a magnetic disk drive using a head/slider after removal of a lead-free solder could be provided.

DETAILED DESCRIPTION OF THE INVENTION

Figure 1:
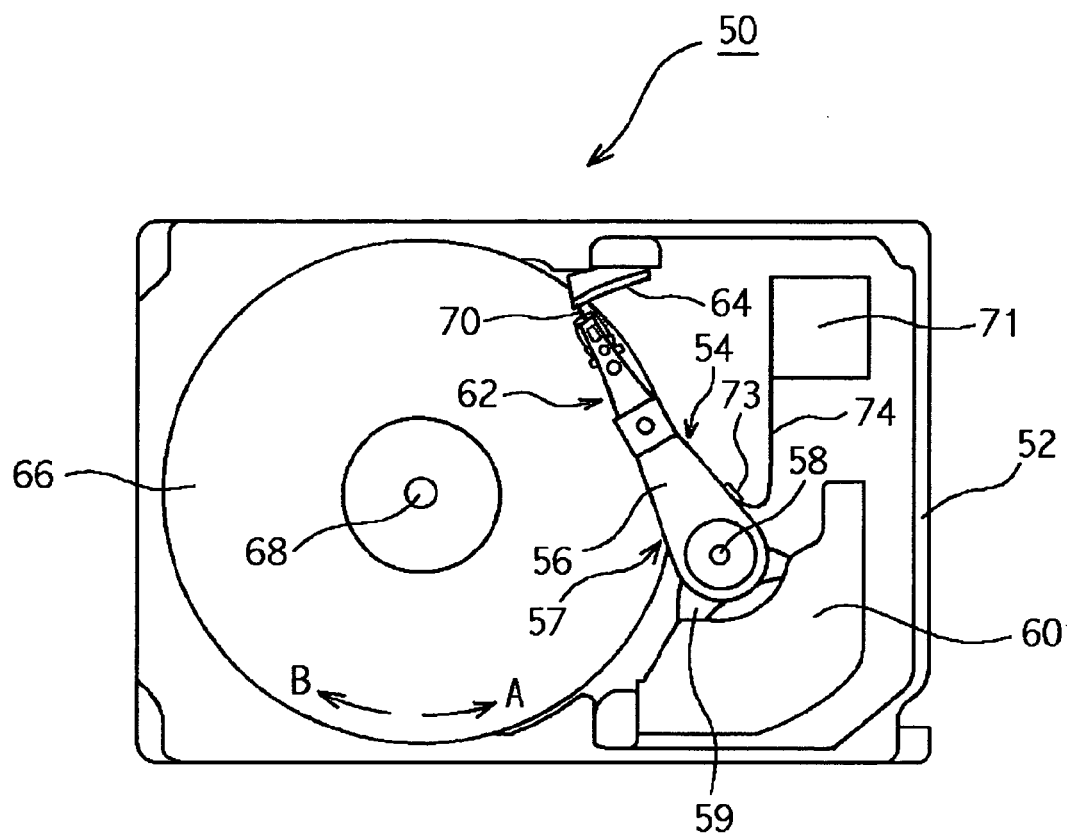
FIG. 1 is a plan view of a magnetic disk drive according to an embodiment of the present invention.

An embodiment of the present invention will be described with reference to the drawings. In all of the drawings, the same components are identified by the same reference numerals. FIG. 1 is a plan view showing a schematic construction of a magnetic disk drive 50 embodying features of the present invention. In the same figure, a base 52 forms a hermetically sealed space conjointly with a base cover (not shown). An actuator head suspension assembly 54, a magnetic disk 66, a ramp 64 and an external terminal 71 connected to a circuit board are accommodated in the interior of the base 52. The magnetic disk 66 is fixed to a spindle hub (not shown) so as to be rotated about a spindle shaft 68 by a spindle motor (not shown). A magnetic layer is formed on at least one surface of the magnetic disk 66. Two or more magnetic disks 66 may be stacked. In relation to the actuator head suspension assembly 54, an arrow A rotation of the magnetic disk 66 is designated a forward rotation and an arrow B rotation of the magnetic disk is designated a reverse rotation. A difference between the forward and reverse rotations appears mainly in the position of a head in a slider. The present invention is applicable to magnetic disk drives of both forward and reverse rotation types.

The actuator head suspension assembly 54 is constituted by an actuator assembly 57 and a head suspension assembly ("HSA" hereinafter) so as to be pivotable about a pivot shaft 58. The actuator assembly 57 is made up of an actuator arm 56 to which the HSA 62 is attached, a coil support 59 which holds a voice coil (not shown), and a pivot housing which corresponds to a connection between the actuator arm 56 and the coil support 59. For constituting a voice coil motor conjointly with the voice coil, a voice coil yoke 60 is provided in the base and a voice coil magnet (not shown), which is a permanent magnet, is attached to the back side of the voice coil yoke 60.

The HSA 62 constitutes a flexure assembly conjointly with a load beam which will be described in detail later. A margin lip 70 is formed at an extreme end of the load beam. Before the magnetic disk 66 stops rotation, the margin lip 70 is allowed to slide up to a retraction surface on the ramp 64, allowing the head/slider to retract from a position above the surface of the magnetic disk 66. Thus, what is called a load/unload method is realized. However, the present invention is not limited its application to a magnetic disk drive of the load/unload type, but is also applicable to a magnetic disk drive of a contact start stop type. The margin lip 70, HSA 62 and actuator arm 56 are formed as a stack structure so as to correspond to a recording surface of the magnetic disk 66. A relay terminal 73 is provided in the actuator assembly 57 to connect between a wiring trace (not shown) one end of which is connected to the head and a flexible printed circuit board 74 one end of which is connected to the external terminal 71.

Figure 2:
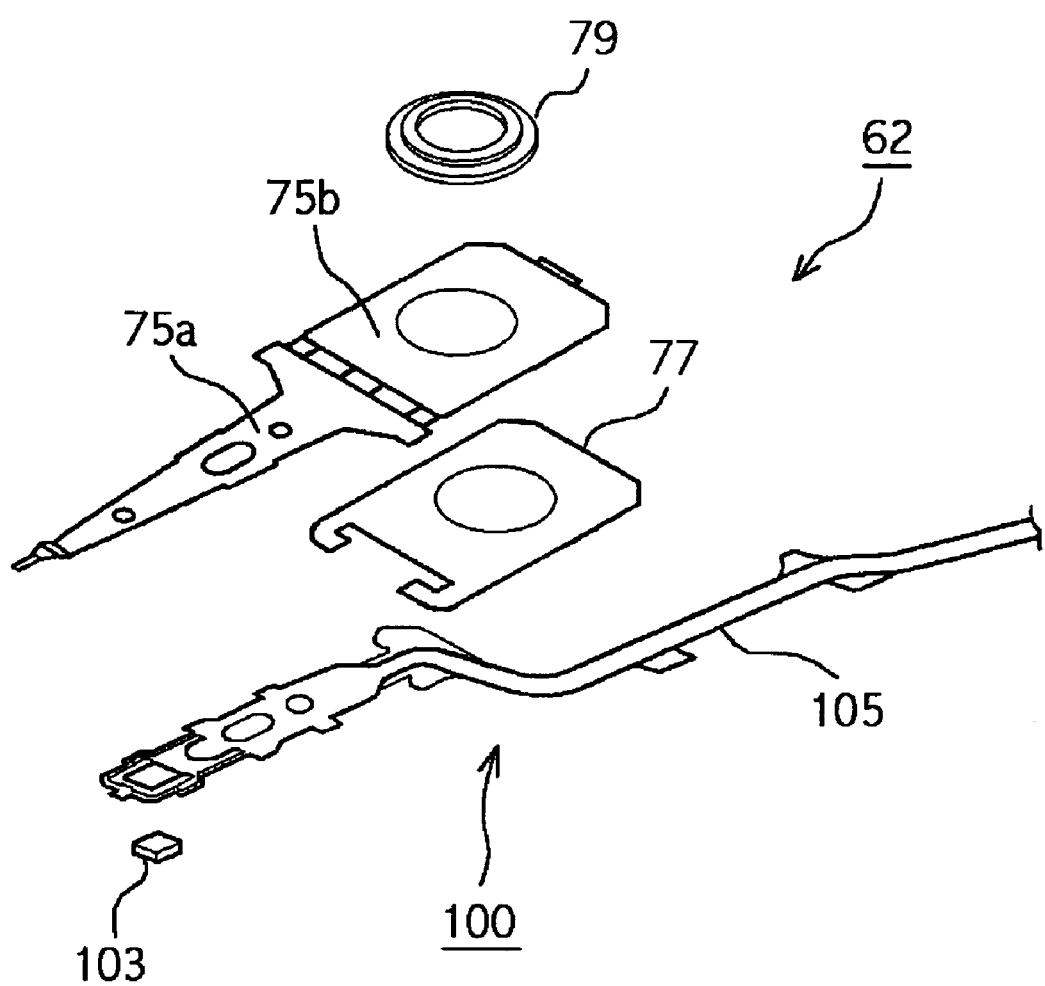
FIG. 2 illustrates the construction of an HSA used in the embodiment.

FIG. 2 is a perspective view illustrating the construction of the HSA 62. The HSA 62 is made up of a mounting plate 79, two pieces of load beams 75a and 75b, a hinge 77, and a flexure assembly 100. As will be described later, the flexure assembly 100 adopts a wiring integrated structure and has a wiring trace 105. A head/slider 103 is attached to a flexure tongue (see the reference numeral 101 in FIG. 3) of the flexure assembly 100 on the side confronting the recording surface of the magnetic disk 66.

The flexure assembly 100 is fixed to the load beams 75a, 75b and the hinge 77 by spot welding or with use of an adhesive. The mounting plate 79, the load beams 75a, 75b and the hinge 77 are also fixed into an integral combination by spot welding or with use of an adhesive. The mounting plate 79 is swaged and the HSA 62 is fixed to the actuator arm 56. The load beams 75a and 75b pivot together with the actuator assembly 57 to carry the head/slider 103 up to a predetermined track and provide a pushing load for pushing the head/slider 103 against the surface of the magnetic disk 66. Under a balanced state of a positive pressure as a lifting force which an air bearing surface receives from an air flow and the pushing load provided from the load beam 75, the head/slider 103 flies while maintaining a certain spacing from the surface of the magnetic disk 66 which is rotating.

One end of the wiring trace 105 is connected to a slider pad (see FIGS. 6 and 8) formed on the head/slider and an opposite end thereof is connected to the relay terminal 73. The wiring integrated type flexure assembly is generally formed by stacking a metal layer as a structure for supporting the head/slider, a conductor layer which constitutes the wiring trace, and a dielectric layer for insulation between the metal layer and the conductor layer. For the prevention of corrosion, a suitable cover layer is formed on the conductor layer, or the conductor layer is subjected to plating. The wiring integrated type flexure assembly having such a stacked structure is classified into three types according to manufacturing methods, which are active type, subtractive type, and flexible substrate type.

The active type is a method wherein constituent layers are stacked in order with use of the photolithography technique. The subtrative type is a method wherein a sheet pre-formed by a metal layer, a dielectric layer, a conductor layer and a cover layer is etched to form a predetermined structure. The flexible substrate type is a method wherein a flexible printed circuit board formed in a predetermined shape using a dielectric layer, a conductor layer and a cover layer is affixed onto a metal layer. Although the flexure assembly 100 used in this embodiment is the active type, the present invention is applicable to the wiring integrated type flexure assembly of any type. Further, the present invention is applicable not only to the wiring integrated type flexure assembly but also to HSA of the type in which flexure and lead wire are separated from each other.

Figure 3:
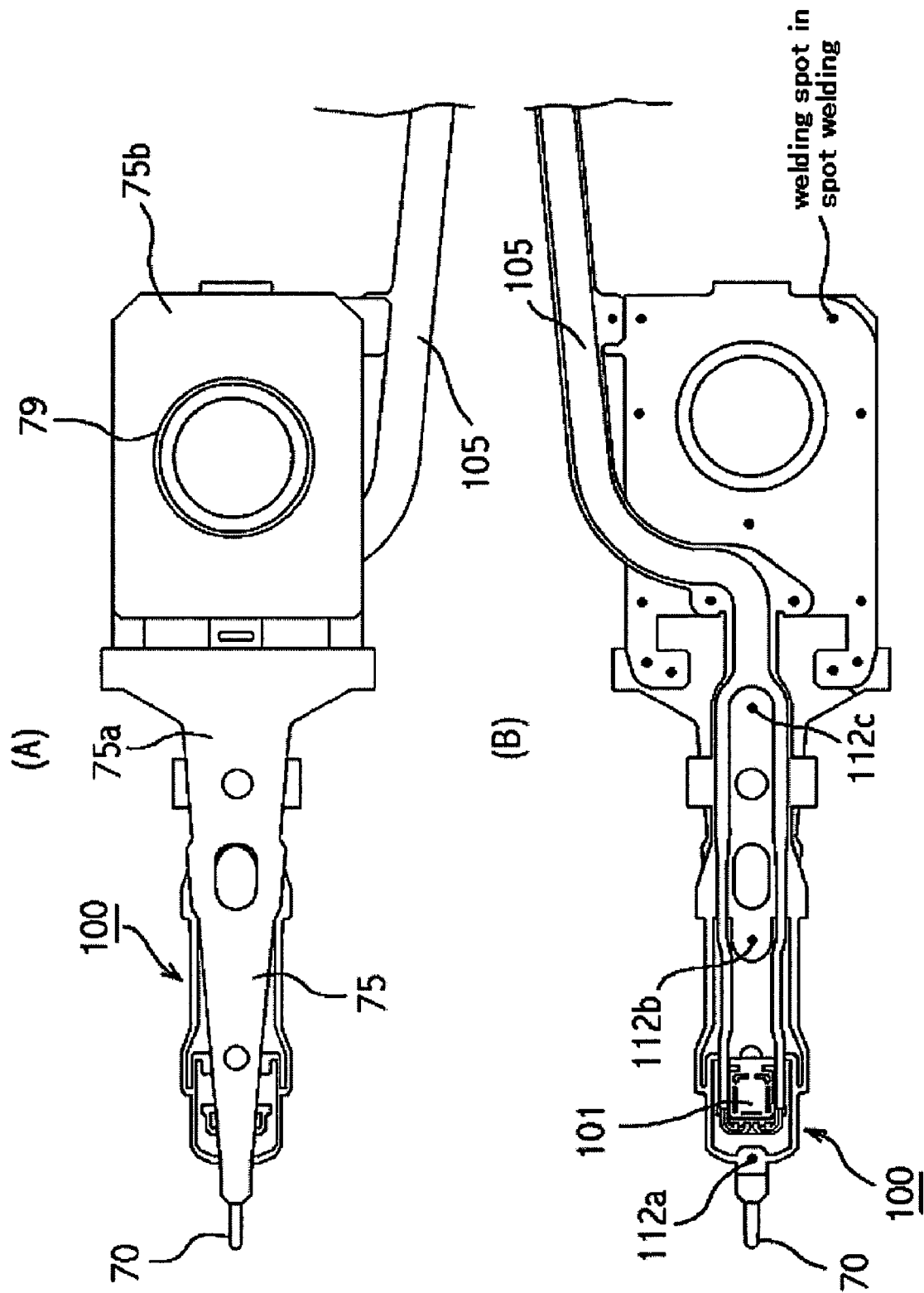
FIG. 3 illustrates the structure of a flexure assembly 100.
Figure 4:
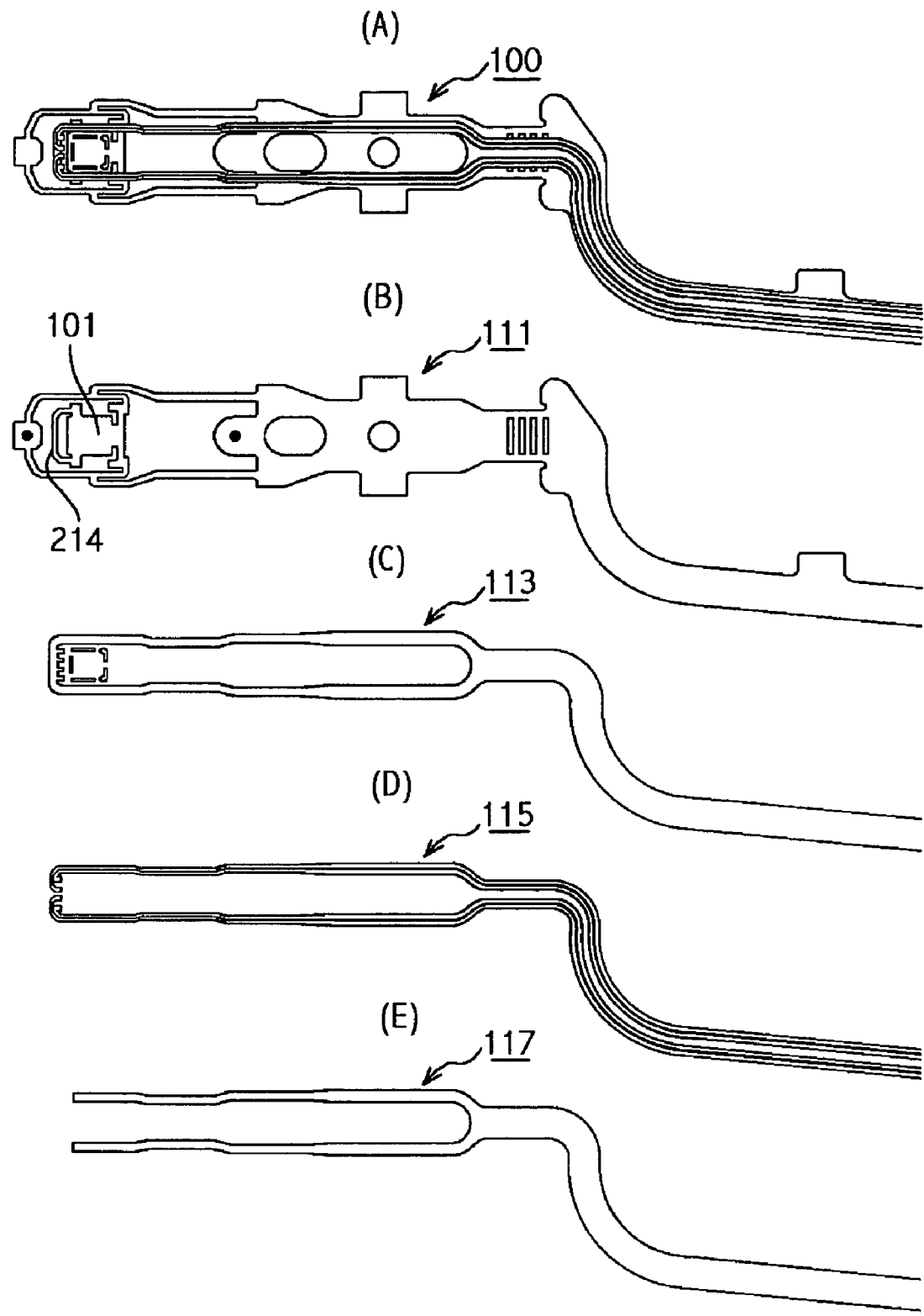
FIG. 4 illustrates the stacked structure of the flexure assembly 100.

FIGS. 3 and 4 are for explaining the structure of the wiring integrated type flexure assembly 100. FIG. 3(A) is a plan view on a larger scale of the flexure assembly 100 as seen from above the load beam and FIG. 3(B) is a plan view on a larger scale of the flexure assembly 100 as seen from below the load beam. In FIG. 3(B) there are shown various welding spots indicative of positions of spot welding which is performed for assembly the flexure assembly. Further, a flexure tongue 101 as a mounting portion of the head/slider 103 is shown in FIG. 3(B). The flexure assembly 100 is fixed to the load beam 75a at three welding spots 112a, 112b and 112c, and the flexure tongue 101 is fixed to the load beam 75a for enabling gimbaled motions.

FIG. 4 illustrates a stacked structure of the wiring integrated type flexure assembly 100 shown in FIG. 3. As noted above, the flexure assembly 100 is formed using a semiconductor processing technique such as photolithographic etching or vapor deposition. The flexure assembly 100 completed by stacking plural layers is shown in FIG. 4(A). Structures of layers which constitute the flexure assembly 100 are shown in FIGS. 4(B) to 4(E). FIG. 4(A) illustrates the completed flexure assembly 100 as seen from the magnetic disk 66 side, in which the head/slider 103 is omitted for simplification of the drawing. FIGS. 4(B) to 4(E) are drawn in order of stacking toward the magnetic disk surface.

FIG. 4(B) shows a plane of a metal layer 111. As the material, SUS 304 having a sheet thickness of 0.02 mm is selected from among 300 Series stainless steels. The material of the metal layer 111 is not limited to stainless steel, but another hard spring material such as beryllium, copper, or titanium may be used. The metal layer 111 includes the flexure tongue 101 and a platform 214.

FIG. 4(C) shows a plane of a dielectric layer 113 formed of polyimide for insulating the metal layer 111 and a conductor layer 115 from each other. The dielectric layer 113 is stacked on the metal layer 111 in a shape conforming to the pattern of the conductor layer 115. In this embodiment, the thickness of the conductor layer is set at about 0.01 mm. A part of the dielectric layer 113 is stacked also on the flexure tongue 101.

FIG. 4(D) shows the conductor layer 115 which is a wiring pattern for the head. In this embodiment, patterning is made by stacking pure copper so as to give a thickness of about 0.01 mm. The material of the dielectric layer is not limited to copper, but another material, e.g., aluminum or silver, may be used. FIG. 4(E) shows a pattern of a cover layer 117 which is for protecting the surface of the conductor layer 115. A polyimide layer having a thickness of about 0.003 mm is deposited on the conductor layer 115. The dielectric layer 113, the conductor layer 115 and the cover layer 117 integrally constitute the wiring trace 105. The thicknesses of the metal layer 111, dielectric layer 113, conductor layer 115 and cover layer 117 are illustrative and the scope of the present invention is not limited thereto.

Figure 5:
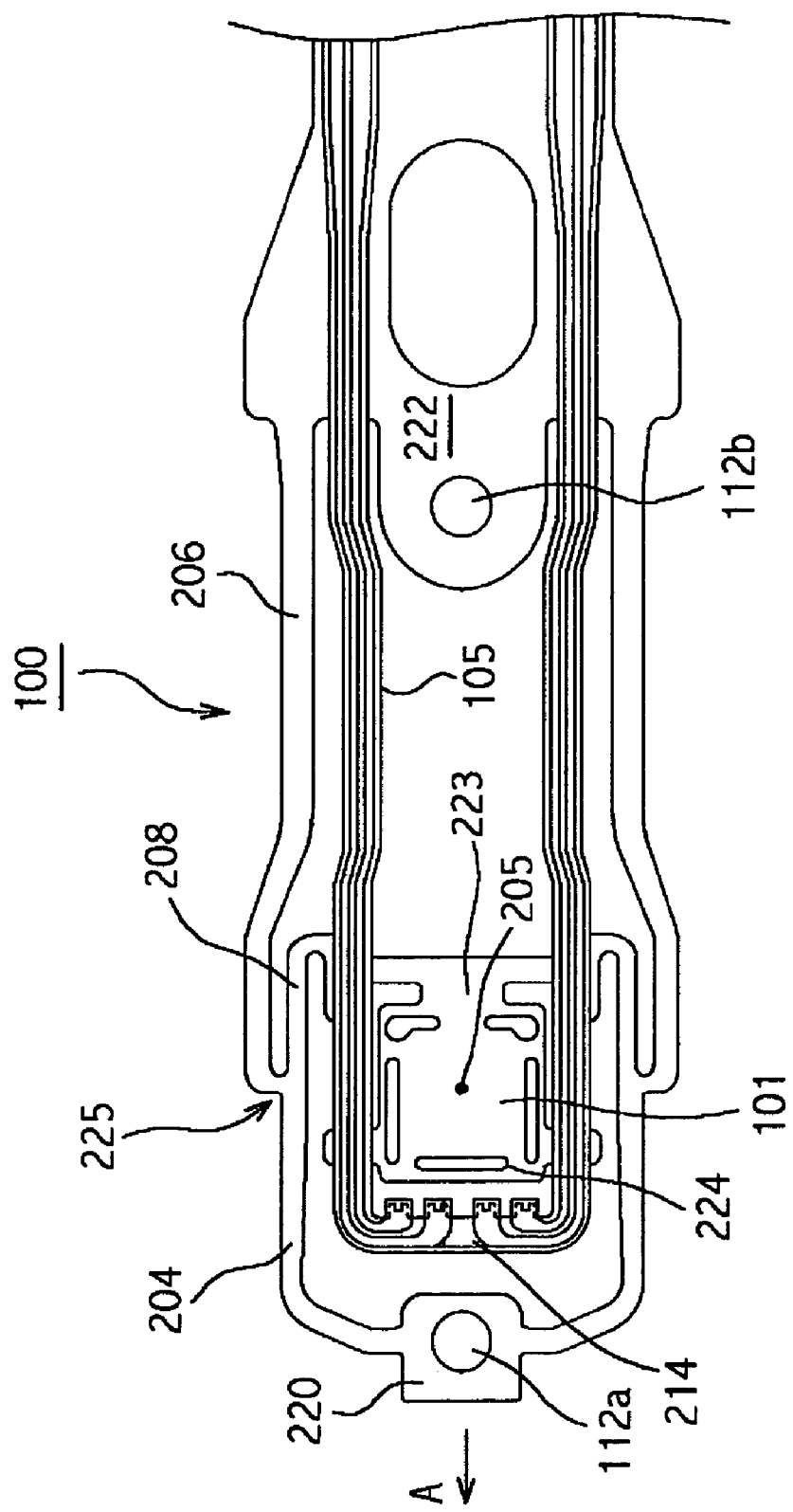
FIG. 5 is an enlarged diagram of the flexure assembly 100 shown in FIG. 4(A).

FIG. 5 illustrates on a larger scale a front end portion of the flexure assembly 100 shown in FIG. 4. In this specification, the margin lip 70 side of HSA 62 is designated a front end side and the actuator arm 56 side is designated a support end side (see FIG. 1). The flexure tongue 101 as a part of the metal layer 111 is formed between the front end-side welding spot 112a and the support end-side welding spot 112b in the flexure assembly 100. In the flexure tongue 101, a dimple contact point ("DCP" hereinafter) 205 is defined on a center line joining the welding spots 112a and 112b and nearly centrally of the flexure tongue 101. On the back side (corresponding to the back of the paper surface) the flexure tongue is put in contact with a dimple formed on the load beam 75a and the DCP 205 constitutes a fulcrum of gimbaled motions. Further, the head/slider 103 is attached to the surface side (corresponding to this side of the paper surface) of the flexure tongue 101.

A support region 220 on the front end side is a part of the metal layer 111 and is spot-welded to the load beam 75a at the welding spot 112a. A pair of band-like main arms 204 extend from edge portions near the welding spot 112a to the support end side symmetrically with respect to a center line joining the welding spots 112a and 112b. The main arms 204 extend to the support end side while surrounding the flexure tongue 101. At a pair of positions 225 the main arms 204 become integral with sub-arms 206 to form a pair of support arms 208 which support a leading edge 223 of the flexure tongue 101. All of the main arms 204, sub-arms 206 and support arms 208 are a part of the metal layer 111.

The leading edge 223 indicates an end portion of the flexure tongue on the side opposite to the side where the head is positioned when the head/slider 103 is mounted to the flexure tongue 101. The end portion on the side opposite to the leading edge of the flexure tongue 101 is designated a trailing edge. In this specification, the terms "leading edge" and "trailing edge" are used also for the head/slider 103 mounted to the flexure tongue.

The flexure assembly 100 used in this embodiment is suitable for the magnetic disk drive of the forward rotation type. In FIG. 1, the magnetic disk 66 rotates in a direction of arrow A from the support end side toward the front end side with respect to the flexure tongue 101. A viscous air flow created on the magnetic disk surface enters between the air bearing surface and the disk surface from the leading edge side and flows out from the trailing edge side, providing a lifting force to the head/slider 103.

A support region 222 as a part of the metal layer 111 is spot-welded to the load beam 75a at the welding spot 112b. A pair of sub-arms 206 extend toward the front end side symmetrically from near the welding spot 112b. Plural island regions 224 of polyimide, which are a part of the dielectric layer 113, are attached to the flexure tongue 101. The island regions 224 are intended to control the posture of the slider at the time of bonding the head/slider 103 onto the flexure tongue 101 through an adhesive. The island regions 224 are stacked on the metal layer 101 in the step of depositing the dielectric layer 113 or the cover layer 117 shown in FIG. 4(C). Further, a pair of wiring traces 105 extend in parallel with the center line from the support region 222 on the support end side up to the trailing edge side of the flexure tongue 101. In the support region 222, the wiring traces 105 adhere to the metal layer 111, but after separation from the support region 222, they extends up to the support arms 208 near the flexure tongue 101 without adhering to any other region of the metal layer 111.

Figure 6:
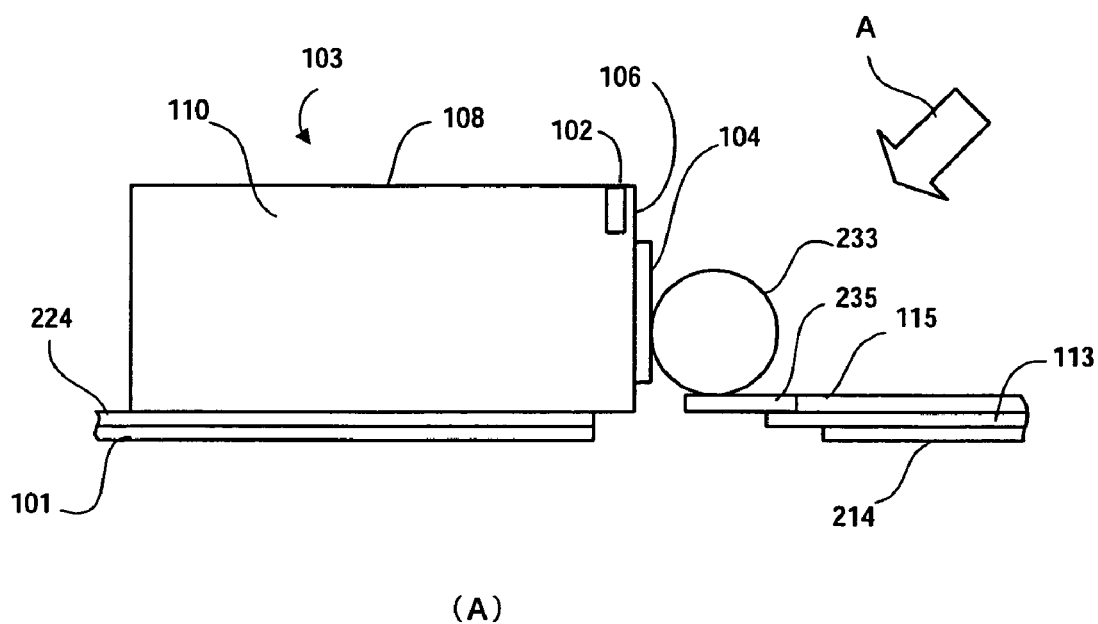
FIG. 6 illustrates the state when a lead pad and a slider pad are connected to each other using a solder ball.
Figure 6:
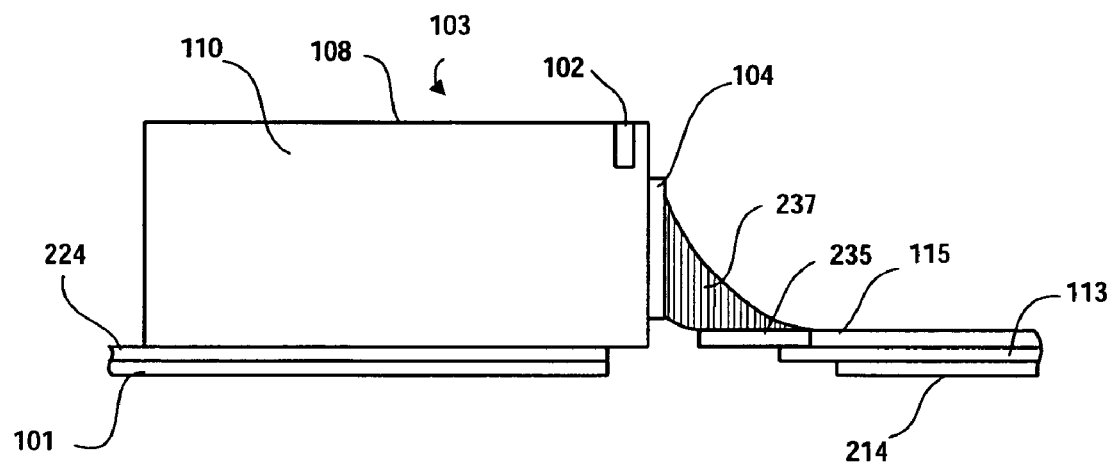

The pair of wiring traces 105 each include two conductor layers and are constituted as four lead wires as a whole. A platform 214 is formed on the trailing edge side of the flexure tongue 101 to align end portions of lead wires with the slider pad at the time of connecting the lead wires to the slider pad formed on the trailing edge-side end face of the head/slider 103. FIG. 6 illustrates a state in which a lead pad and a slider pad are solder ball-connected using a lead-free solder. The metal layer 101 which constitutes a flexure support structure and the platform 214 as a part of the metal layer 101 are shown in FIG. 6(A).

Dielectric layers 224 and 113 are stacked on the metal layer 101 and the platform 214, respectively. A conductor layer 115 which constitutes a lead wire is stacked on the dielectric layer 113. The conductor layer 115 will hereinafter be referred to also as lead wire 115. A lead pad 235 is formed at a front end of the led wire 115. The head/slider 103 is fixed onto the dielectric layer 224 through an adhesive. A magnetic head 102 is formed in a slider body 110 of the head/slider 103 and a slider pad 104 connected to the magnetic head 102 is formed on an end face 106 of the slider body 110. Four slider pads 104 are formed correspondingly to the number of lead wires. The magnetic head 102 and the slider pad 104 are connected with each other in the interior of the slider body 110. An end face 108 of the slider body 110 is an ABS.

As shown in FIG. 6(A), a soldering surface of the lead pad 235 and that of the slider pad 104 are disposed at right angles. For solder ball connection between the lead pad 235 and the slider pad 104, first the HSA 62 is fixed to a jig in such a manner that a plane which divides the angle of 90° formed by the surface of the lead pad 235 and the surface of the slider pad 104 into 45° portions faces in the vertical direction. Next, a spherical solder ball 233 formed using a lead-free solder is placed temporarily between the lead pad 235 and the slider pad 104. Next, laser light is radiated to the solder ball 233 in the direction of arrow A in FIG. 6(A) to melt the solder ball. Then, the emission of laser light is stopped and the solder ball is allowed to stand for cooling. As a result, a solder fillet 237 is formed, whereby the lead pad 235 and the slider pad 104 are electrically connected with each other.

At the time of reflowing the solder ball 233 with laser light in solder ball connection, there may occur various connection defects such as melted solder being strongly attracted to one pad and the solder fillet 237 not connected to the other pad, the area and strength of connection between the solder fillet 237 and the pad being insufficient, and the occurrence of a short-circuit with an adjacent pad. Therefore, a mutual disposition relation and surface conditions of the slider pad 104 and the lead pad 235 are defined strictly. After the solder ball connection of the slider pad 104 and the lead pad 235, an electrical test is conducted for all of the relay terminal shown in FIG. 1, the wiring traces 105 and the head 102.

When the wiring traces 105 or the solder fillet 237 are found to be defective, the head/slider 103 in the flexure assembly 100 is re-utilized. Therefore, the size and surface condition of the slider pad 104 on the head/slider 103 to be re-utilized are important for the attainment of satisfactory soldering in re-utilization. For example, if the surface of the slider pad 104 is inclined, a solder ball when placed temporarily may roll and fall down to this side or in the depth direction in FIG. 6(A) or may be displaced from the exact position. Moreover, the thickness of the slider pad 104 relative to the end face 106 of the slider body 110 should be within a tolerance range of the original slider pad thickness. Otherwise, it will become difficult to attain a satisfactory solder ball connection.

Further, it is desirable that the surface of the slider pad retain an appropriate solder wettability. Therefore, at the time of removing the solder fillet 237 from the slider pad 104 of the head/slider 103, it is necessary to not only prevent the slider pad 104 from damage but also ensure a state in which re-connection using the solder ball can be done in a satisfactory manner.

Figure 7:
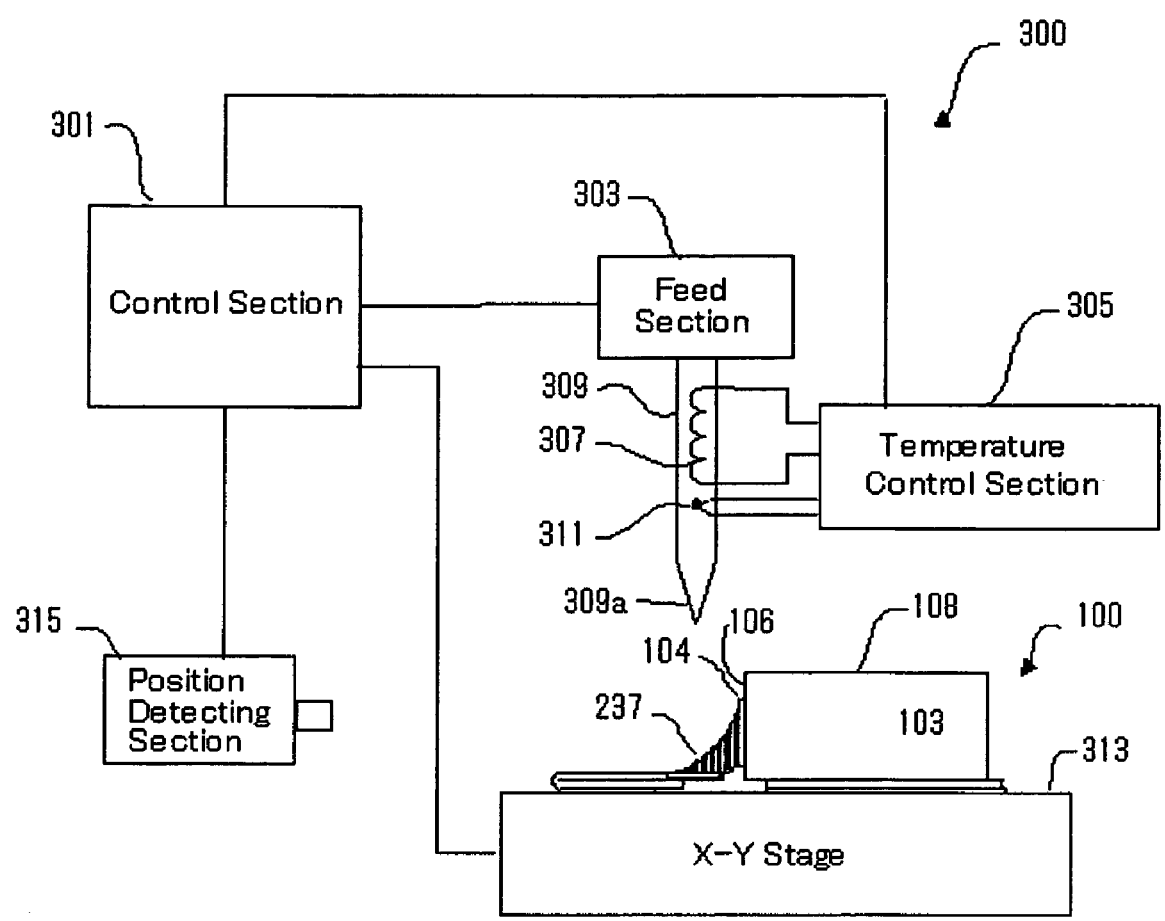
FIG. 7 is a schematic block diagram of a lead-free solder cutting device.

FIG. 7 is a schematic block diagram of a lead-free solder cutting device 300. In a state in which the flexure assembly 100 is fixed to an X-Y stage 313 in such a manner that the ABS 108 of the head/slider 103 faces upward, the X-Y stage 313 can move precisely in X-Y direction on a horizontal plane in accordance with a position control signal which the X-Y stage receives from a control section 301. Instead of the flexure assembly 100, the HSA 62 may be fixed to the X-Y stage 313. A position detecting section 315 is for detecting the position of the head/slider 103 relative to a cutting tool 309 in a non-contact manner and it may be constituted by a laser displacement meter for example. The laser displacement meter radiates laser light emitted from a projection optical system to a side face of the head/slider 103, The reflection thereof is collected by a reception optical system, then calculates the position in X-Y direction relative to the head/slider 103 of a feed section 303 and sends the result of the calculation to the control section 301.

A feed section 303 feeds the cutting tool 309 in the vertical direction (Z direction) toward the head/slider to cut the solder fillet 237 under the control made by the control section 301. A cutting position in the thickness direction (X direction) of the slider pad 104 in which the cutting tool 309 cuts the solder fillet 237 is defined as a position relative to the end face 106 on which the slider pad of the head/slider 103 is formed as will be described with reference to FIG. 8. For defining the cutting position of the cutting tool 309 relative to the end face 106, the feed section 303 may move upon receipt of a position control signal from the control section 301 instead of the X-Y stage 313 moving upon receipt of the position control signal from the control section.

A heater 307 and a temperature sensor 311 are embedded in the cutting tool 309. A temperature setting unit is provided in the temperature control section 305, whereby an electric current to be applied to the heater 307 can be controlled in accordance with the melting point of the solder fillet 237. The temperature control section 305 controls the heater current so that, once the melting point of lead-free solder to be cut is set by the temperature setting unit, the temperature of an edge 309a of the cutting tool 309 does not exceed the melting point of the solder fillet 237 but reaches a temperature as close as possible to the melting point.

For setting the temperature of the edge 309a to a predetermined value, a temperature sensor is attached beforehand to the edge portion and a relation between the temperature set by the temperature setting unit and the temperature of the edge 309a is determined beforehand by experiment. Once a melting point temperature K° C. is set by the temperature setting unit in the temperature control section 305, the cutting device 300 can control the temperature of the edge 309a in the range of (K−10° C.)-10° C. during cutting of the solder fillet. That is, the edge 309a is heated to a temperature in the range of between the melting point of the lead-free solder and a temperature about 20° C. lower than the melting point. As a result, the cutting tool 309 can soften the solder fillet 237 to the extent that the solder fillet can be cut easily without being melted.

The temperature sensor 311 monitors whether the generation of heat from the heater is appropriate or not during the cutting work and, in the event of occurrence of any abnormal condition, a signal is provided from the temperature control section 305 to the control section 301 to stop the cutting work. When the temperature of the edge 309a becomes higher than the melting point of the lead-free solder, the solder fillet 237 melts and causes a short-circuit between slider pads 104 or solder lumps may be formed on the surface of the slider pad 104 with consequent unevenness of the slider pad surface, thus making re-utilization of the head/slider 103 difficult.

The above problems are influential particularly when a solder ball is used for re-connection. Further, if the temperature of the edge 309a rises too high, the heat of the edge may be transmitted to the head 102 with consequent deterioration of performance. On the other hand, if the temperature of the edge 309a is too low, it is virtually impossible to soften the lead-free solder to a satisfactory extent. Therefore, if the feed section 303 feeds the cutting tool in this state, the slider pad 104 will be damaged to the extent that the head/slider 103 cannot be re-utilized.

The control section 301 controls the entire operation of the lead-free solder cutting device 300. The control section 301 receives a position signal for the feed section 303 in the head/slider 103 from the position detecting section 315 and makes control to stop the movement of the X-Y stage or the feed section 303 upon arrival of the head/slider 103 at a predetermined position. At this time, a positional relation between the cutting tool 309 and the head/slider 103 is established. Upon receipt from the temperature control section 305 a signal indicating that temperature conditions exist and from the position detecting section 315 a signal indicating that position conditions exist, the control section 301 provides a cutting start signal to the feed section 303. Likewise, upon receipt from the temperature control section 305 a signal indicative of an abnormal temperature detected by the temperature sensor 311, the control section 301 provides a stop signal to the feed section 303 to stop the cutting work.

Figure 8:
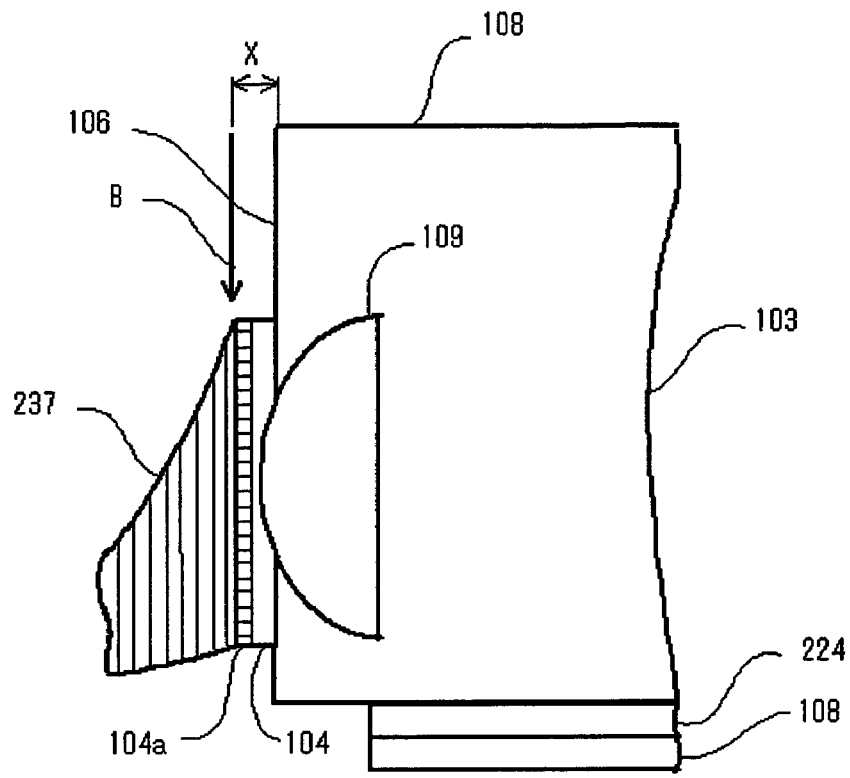
FIG. 8 illustrates the position a solder fillet is cut using a cutting tool.
Figure 8:
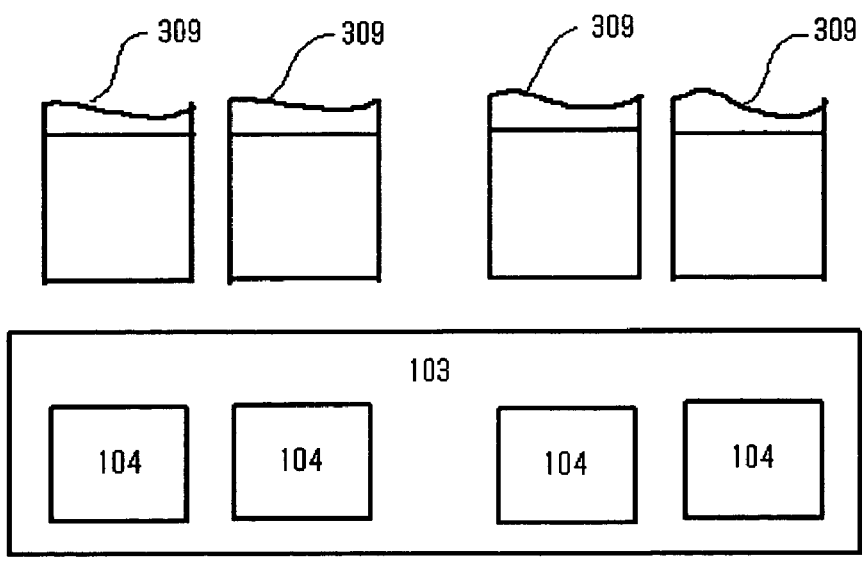

FIG. 8 illustrates a cutting position of the solder fillet to be cut by the cutting tool. FIG. 8(A) shows a partial section of the head/slider 103 and FIG. 8(B) shows a front side of the slider pad 104. The solder fillet 237 is not shown in FIG. 8(B) for simplification of the drawing. Copper pads 109 are provided on the head/slider 103 correspondingly to the four slider pads 104. The copper pads 109 are connected to the head and are partially exposed from the end face 106 of the slider body. Gold slider pads 104 are formed on surfaces of the copper pads 109.

With the solder fillet 237 formed on the slider pad 104 as shown in FIG. 8(A), a surface portion 104a of each slider pad 104 changes in quality into a solder-gold alloy layer or an intermetallic compound layer with heat generated in reflow. For example, if an Sn—Ag solder is used as the lead-free solder, there is formed an alloy layer 104a of tin, silver and gold. The position of the X-Y stage or of the feed section is adjusted so that the edge 309a of the cutting tool 309 is positioned on the surface of the alloy layer 104a as indicated with arrow B which is spaced a distance X from the end face 106. In this embodiment, the thickness X of the slider pad 104 from the slider end face 106 is about 10 μm and the thickness of the alloy layer is about 5 μm.

When the edge 309a of the cutting tool 309 is set to such a cutting position, an actually passing position of the edge 309a lies in the solder fillet 237 close to the alloy layer 104a or in the alloy layer 104a, taking into account a tolerance for the thickness X of the slider pad 104 and the positioning accuracy of the X-Y stage. If the layer of only gold which underlies the alloy layer 104a is exposed, the thickness of the slider pad 104 changes too much at the time of performing solder ball connection by re-utilizing the head/slider 103, thus making it difficult to form the solder fillet 237 of good quality. This is not desirable. A similar problem exists also in that a thick layer of the solder fillet 237 remains on the alloy layer 104a after cutting of the solder fillet 237.

The position of the cutting tool relative to the end face 106 is determined so that the copper pads 109 are not exposed under any circumstances. As shown in FIG. 8(B), four cutting tools 309 are held by the feed section 303 so as to move integrally with respect to the four slide pads 104. With the four cutting tools 309, four solder fillets 237 are cut simultaneously. The length and width of each slider pad are each in the range of about 135 to 140 μm.

Figure 9:
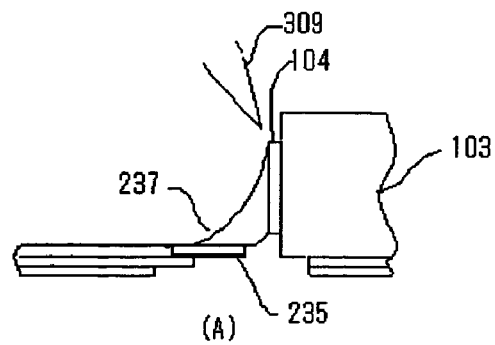
FIG. 9 illustrates the state when the solder fillet is cut.
Figure 9:
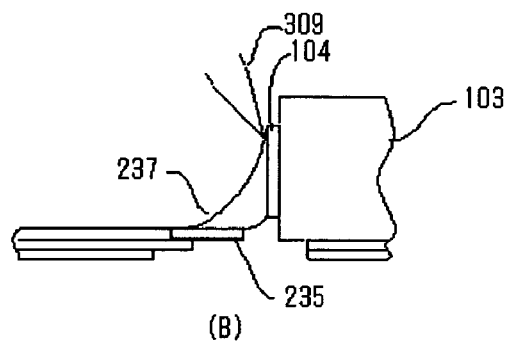
Figure 9:
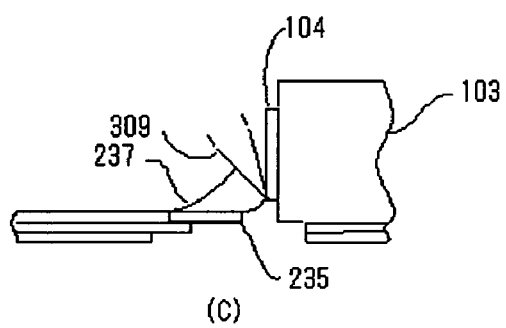
Figure 9:
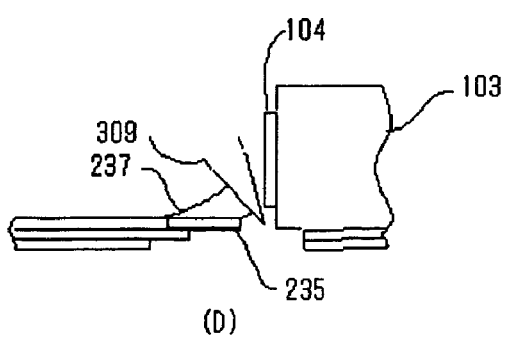
Figure 10:
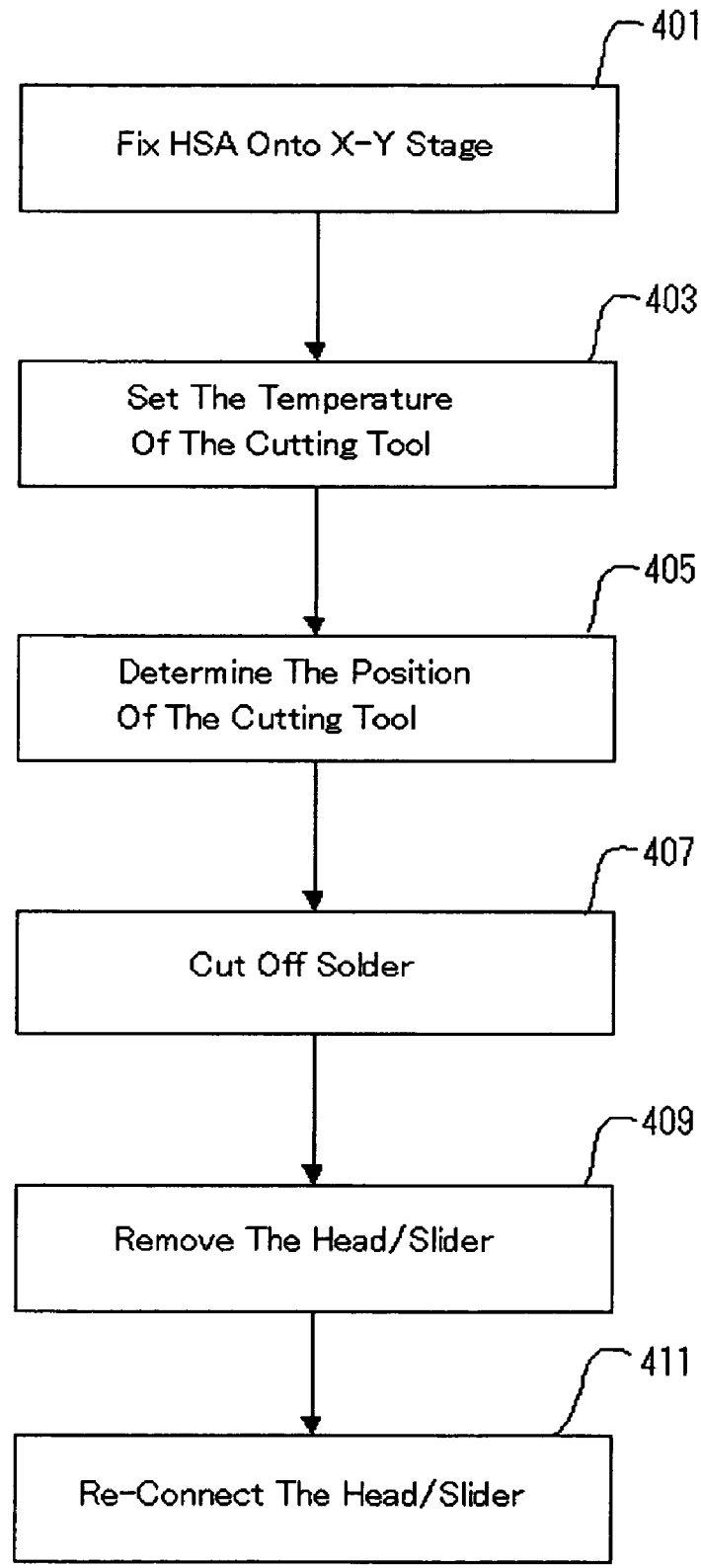
FIG. 10 is a flow chart illustrating the procedure the solder fillet is cut and a head/slider is re-utilized.

With reference to FIGS. 9 and 10, a description will be given about in what procedure the solder fillet 237 is cut and the head/slider 103 is re-utilized. FIG. 9 illustrates in what state the solder fillet 237 is cut and FIG. 10 is a flow chart illustrating a re-utilization procedure. In block 401, the flexure assembly 100 is fixed to the X-Y stage 313. The solder fillet 237 is formed of a lead-free solder having a composition of Sn(85-95 wt %)/Ag(1-3 wt %)/Bi(1-5 wt %)/Cu(1 wt % or less) and the melting point thereof is in the range of about 210° C. to 216° C.

In block 403, the set temperature in the temperature control section 305 is set at 210° C. for heating the cutting tool 309. Once the cutting of the solder fillet 237 is started, the temperature of the cutting tool 309 drops a little. However, if the temperature of the temperature setting unit in the temperature control section 305 is set at 210° C., the temperature of the edge 309a can be held at 200° C.±10° C. in the cutting work including cutting of the solder fillet 237. Thus, the temperature of the edge 309a does not exceed the melting point of solder but is held at a temperature which is not higher than the melting point of the solder and which is the highest in point of performance of the device. In this way it is possible to soften the lead-free solder and prevent a cutting stress from being imposed on the slider pad.

In block 405, the control section 301 transmits a position control signal to the X-Y stage 313 in accordance with a signal provided from the position detecting section 315. As a result, the X-Y stage operates in accordance with the control signal and stops at a predetermined position in the X-Y direction. In the X direction, positioning is made at a predetermined distance from the end face 106 in order to make the surface of the alloy layer 104a a target cutting position, as shown in FIG. 8(A), while in the Y direction, positioning is made so that the cutting tools 309 and the slider pads 104 are aligned with each other, as shown in FIG. 8(B). This state is shown in FIG. 9(A). When temperature conditions of the edge 309a and positional conditions of the head/slider 103 are established, the control section 301 transmits in block 407 a cutting start signal to the feed section 303 to start cutting the solder fillet 237. The cutting tools 309 move in parallel with the surfaces of the slider pads 104 so that cutting traces on the slider pad 104 side after cutting of the solder fillet 237 become flat.

An actual cutting position is determined depending on the tolerance in thickness X of the slider pad and the positioning accuracy of the X-Y stage. Cutting states are shown in FIGS. 9(B) to 9(D). In FIG. 9(D), when the solder fillet 237 is cut off completely from the slider pad 104, the surface of the slider pad 104 presents a cutting trace of a flat alloy layer 104a or a flat solder fillet 237. Therefore, when the head/slider 103 is connected to the lead pad of another flexure assembly, the height of each slider pad is within the tolerance and the solder ball 233 can be temporarily placed in an exact position between adjacent pads because of a flat surface.

Moreover, the alloy layer 104a or the solder fillet 237, which forms a cutting trace, exhibits a similar action to the action of spare solder, whereby the solder wettability is improved and the re-connection of solder is facilitated thereby. In addition, since the portion to be cut of the solder fillet 237 is softened by the edge 309a, a mechanical stress imposed on the slider pad 104 in the cutting work is small and there is no fear of damage to the slider pad 104. Since the softening of the solder fillet is performed through the cutting tool 309, a thermal stress imposed on the head of the head/slider is also small. Further, melting of the solder does not occur because the temperature of the edge 309a is controlled to a temperature of not higher than the melting point of the lead-free solder.

In block 409, as shown in FIG. 9(D), the head/slider is removed from the flexure tongue 101 after the solder fillet 237 is cut off from the slider pads 104. In block 411, the head/slider 103 thus removed is attached to another flexure assembly and the re-connection is made in accordance with the solder ball connecting method using the lead-free solder. Each slider pad 104 shrinks with the heat of reflow applied in the initial solder ball connection, but further shrinks with reflow heat in re-connection and becomes smaller in its length and width dimensions. Thus, the slider pad which has been soldered only once and the slider pad which has been re-connected are different in their length and width dimensions beyond the range of tolerance and therefore it is possible to distinguish the two from each other.

In the present invention, the solder fillet forming method is not limited to the connecting method based on the reflow of a lead-free solder ball in both initial connection and re-connection. Any other method may be adopted, for example, a method wherein a lead-free yarn-like solder is connected using a soldering iron or a method wherein a lead-free solder lump other than the ball shape is connected by reflow.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for removing a lead-free solder from a slider pad provided on a head/slider used in a magnetic disk drive, comprising:
   providing a cutting tool for removing said lead-free solder;
   heating said cutting tool to a temperature at which said lead-free solder softens and which is not higher than the melting point of the lead-free solder; and
   removing said lead-free solder from said slider pad using the heated cutting tool.

2. A method according to claim 1, wherein heating said cutting tool comprises heating said cutting tool so that the temperature of an edge of the cutting tool is in the range of between the melting point of said lead-free solder and a temperature about 20° C. lower than said melting point.

3. A method according to claim 1, wherein removing said lead-free solder comprises maintaining an edge of said cutting tool at a temperature of between the melting point of said lead-free solder and a temperature about 20° C. lower than said melting point while the cutting tool is in contact with the lead-free solder.

4. A method according to claim 1, wherein removing said lead-free solder comprises moving an edge of said cutting tool along a plane parallel to a surface of said slider pad lying at a position spaced a predetermined distance from a surface of said head/slider on which said slider pad is formed.

5. A method according to claim 1, wherein said lead-free solder is a solder ball-connected solder fillet.

6. A method according to claim 1, wherein said slider pad is formed of gold.

7. A method according to claim 6, wherein said lead-free solder is a solder fillet which connects a lead pad and said slider pad with each other, and an alloy layer of said gold and said lead-free solder is formed on a surface of said slider pad.

8. A method according to claim 7, wherein removing said lead-free solder comprises flattening said alloy layer formed on said gold in a cutting trace formed by said cutting tool.

9. A method according to claim 7, wherein removing said lead-free solder comprises flattening said solder fillet deposited on said alloy layer in a cutting trace formed by said cutting tool.

10. A method for re-utilizing a head/slider used in a magnetic disk drive, comprising:
providing a flexure assembly in which a lead pad formed on a lead wire and a slider pad formed on said head/slider are connected with each other through a solder fillet of a lead-free solder;
providing a cutting tool for cutting said lead-free solder;
heating said cutting tool to a temperature at which said lead-free solder softens and which is not higher than the melting point of the lead-free solder;
cutting a position near a boundary between said solder fillet and said slider pad using the heated cutting tool; and
removing said head/slider from said flexure assembly.

11. A method according to claim 10, wherein said flexure assembly is a wiring integrated type suspension.

12. A method according to claim 10, further comprising fixing the removed head/slider to said flexure assembly and re-connecting said slider pad and said lead pad on the lead wire in the flexure assembly with each other by a solder ball connection of the lead-free solder.

13. A method according to claim 10, wherein said solder fillet is formed by a solder ball connection.

14. A magnetic disk drive comprising:
a magnetic disk;
a flexure assembly having a head/slider with a slider pad formed thereon and a lead wire with a lead pad formed thereon, said slider pad and said lead pad being soldered to each other; and
an actuator assembly which supports said flexure assembly;
wherein a soldered surface of said slider pad is formed by removing a solder fillet of a lead-free solder connected to said slider pad using a cutting tool having been heated to a temperature at which said lead-free solder softens and which is not higher than the melting point of the lead-free solder.

15. A magnetic disk drive according to claim 14, wherein said slider pad and said lead pad are connected with each other through a solder ball-connected solder fillet of a lead-free solder.

16. A magnetic disk drive according to claim 14, wherein said flexure assembly is a wiring integrated type suspension.

17. A lead-free solder cutting device for cutting a solder fillet of a lead-free solder from a slider pad formed on a head/slider used in a magnetic disk drive, comprising:
a stage configured to fix a flexure assembly to which said head/slider is attached;
a feed section configured to feed a cutting tool;
a position detecting section configured to detect the position of said head/slider relative to said cutting tool;
a temperature control section configured to control the temperature of said cutting tool to a temperature at which said lead-free solder softens and which is not higher than the melting point of the lead-free solder; and
a control section which, upon receipt of a signal from said position detecting section, transmits a position control signal to said stage or said feed section.

18. A lead-free solder cutting device according to claim 17, wherein said control section defines a cutting position for cutting said solder fillet by said cutting tool in terms of a distance from an end face of said head/slider with said slider pad formed thereon.

19. A lead-free solder cutting device according to claim 18, wherein said cutting position is a position at which an alloy layer of a constituent metal of said slider pad and said lead-free solder is to be allowed to remain on said head/slider.

20. A lead-free solder cutting device according to claim 18, wherein said cutting position is a position at which said solder fillet is to be allowed to remain on said head/slider.

* * * * *